United States Patent [19]

Takita

[11] 3,940,645
[45] Feb. 24, 1976

[54] SMALL-SIZED SYNCHRONOUS MOTOR

[75] Inventor: Ryoichi Takita, Urawa, Japan

[73] Assignee: Rhythm Watch Co. Ltd., Japan

[22] Filed: Oct. 24, 1974

[21] Appl. No.: 517,779

[30] Foreign Application Priority Data
Oct. 30, 1973 Japan.............................. 48-124972

[52] U.S. Cl. ................. 310/156; 310/164; 310/263
[51] Int. Cl.² ........................................ H02K 21/12
[58] Field of Search .......... 310/40 MM, 40, 46, 49, 310/162–165, 156, 257, 263

[56] References Cited
UNITED STATES PATENTS

| | | | |
|---|---|---|---|
| 3,427,485 | 2/1969 | Dotto................................... | 310/164 |
| 3,469,131 | 9/1969 | Stellwagen...................... | 310/156 X |
| 3,496,393 | 2/1970 | Reifman et al. ................. | 310/156 X |
| 3,541,363 | 11/1970 | Vetterman et al..................... | 310/49 |
| 3,737,746 | 6/1973 | Cielaszyk et al................... | 310/37 X |
| 3,803,430 | 4/1974 | daCosta et al. ............... | 310/40 MM |
| 3,855,490 | 12/1974 | Sidell.................... | 310/162 |
| 3,878,414 | 4/1975 | Harakawa........................... | 310/156 |

*Primary Examiner*—Donovan F. Duggan
*Attorney, Agent, or Firm*—McGlew and Tuttle

[57] ABSTRACT

The synchronous motor, applicable to battery powered clocks is so designed that the north and south poles, formed on the peripheries of a pair of rotor discs, are bent so as to extend parallel to the arbor and to be staggered on the peripheral surface of the rotor. The gap distance between the north and south poles is larger than that between the poles and the corresponding pole faces of a stator which has a magnetic flux induced therein by an AC energizing circuit, whereby the efficiency of the motor may be improved significantly.

6 Claims, 9 Drawing Figures

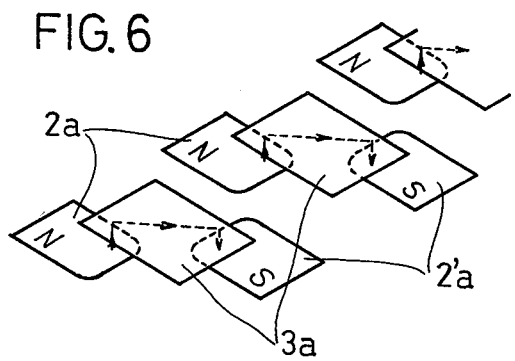
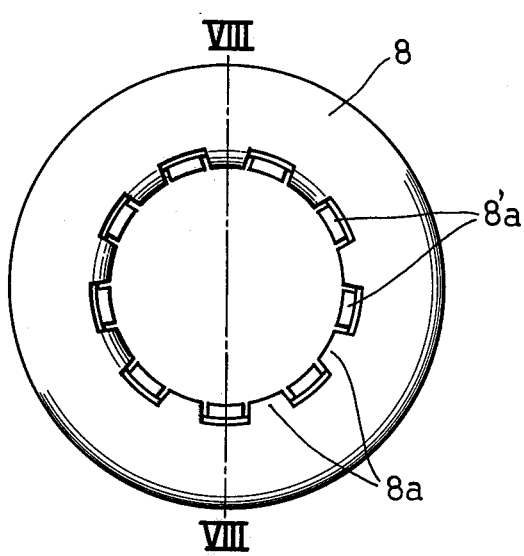
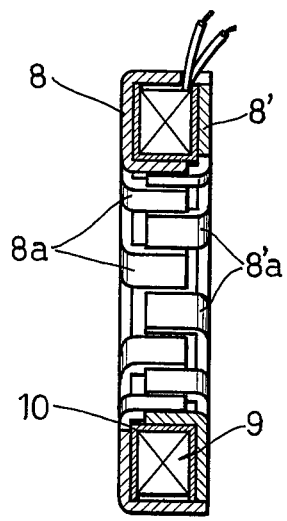
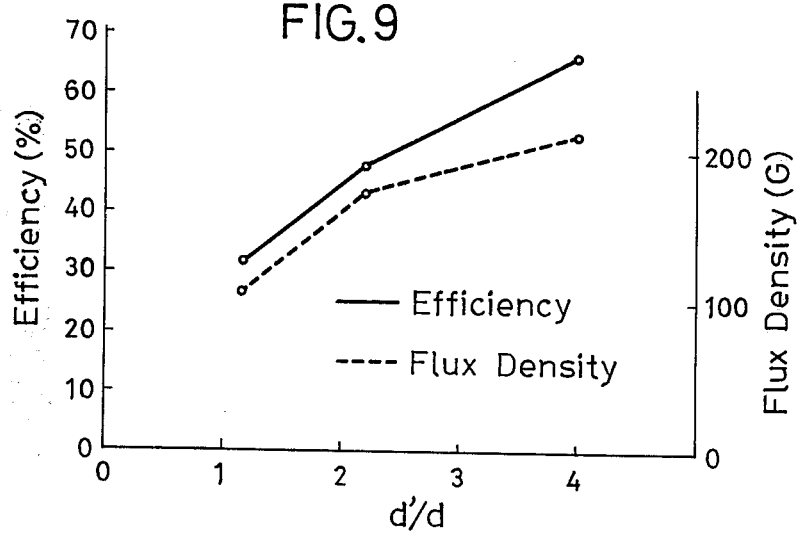

SMALL-SIZED SYNCHRONOUS MOTOR

BACKGROUND OF THE INVENTION

The present invention relates to synchronous motors for clocks capable of being operated through a single energizing winding.

Such synchronous motors are generally so designed that magnetic flux induced in the stator by an AC energized winding or windings is distributed around the rotor consisting of a thin cylindrical permanent magnet and a pair of discs made of permeable materials, each of which discs has a plurality of north or south poles on its periphery and between which discs the permanent magnet is sandwiched in, so as thereby to cause rotor to rotate.

The application of such synchronous motors to electric clocks, or the like, has been regarded as being advantageous in view of the fact that the necessity for converting the reciprocating motion, of a balance wheel, pendulum, or the like, into rotary motion may be eliminated thereby.

Two types of synchronous motors have hitherto been developed, one type being so constructed that AC induced magnetic fluxes are generated through plural winding coils arranged around the rotor, while the other type being so constructed that AC induced magnetic flux is generated around the rotor through a single winding coil. The motor of the former type has been unable to be applied in electric clocks in view of its expensiveness as well as its incapability of rotating at low speeds, while the motor of the latter type has hitherto been applied to the electric clocks because of its simple structure, inexpensiveness and capability of rotating at low speeds. However, the synchronous motor of the latter type (such motor will be merely called "the motor" hereinafter in the specification and claims) operates at a low efficiency in general, so that, even if the stator magnetic circuit and the rotor discs are made of highly permeable materials, the motor has not been able to be applied to battery powered clocks without changing or recharging the batteries within a shorter period. As for the above-mentioned highly permeable materials, for example, "METALS HANDBOOK", 8th Edition, Vol. 1, pp. 794–797, 1961 (published by American Society for Metals) is referred to.

SUMMARY OF THE INVENTION

In an investigation of the construction of the poles on the discs of rotors of motors applicable to battery powered clocks, it has been found that, when the north and south poles formed on the peripheries of the rotor discs, which latter are arranged on opposite surfaces of the permanent magnet, were bent so as to extend parallel to the arbor and to face each other, while being staggered around the periphery of the permanent magnet, if the gap distance between the north and south poles is larger than the gap distance between the poles and the corresponding pole faces of the stator, which has magnetic flux induced therein by an AC energizing circuit, the efficiency of the motor could be improved significantly.

An object of the present invention is accordingly to provide a synchronous motor of high efficiency while having a simple structure.

Another object of the invention is to provide a synchronous motor capable of operating continuously all the year round or more using one or two "C" size dry cell(s) for battery powered clocks or quartz crystal clocks.

A further object of the invention is to provide a synchronous motor having a plurality of poles and operable at desired relatively low rotational speeds thereby not causing excessive bearing wear and gear noise.

BRIEF DESCRIPTION OF THE DRAWINGS

Still further objects and the entire scope of applicability of the present invention will become apparent from the following detailed description of the invention referring to the accompanying drawings, in which:

FIG. 6 is a diagramatic perspective view of a portion of the stator pole faces and the adjacent disc poles of the rotor, illustrating the path of the DC magnetic flux emanated from the permanent magnet in the present invention;

FIG. 7 is a plan view of the stator of another embodiment of the motor according to the invention;

FIG. 8 is a sectional view of FIG. 7 on the line VIII—VIII; and

FIG. 9 is a graph drawn on the rectangular co-ordinates showing the comparison of the efficiency as well as the magnetic flux density with periphery of the rotor of the motor in FIG. 1, with those of the conventional motor.

DESCRIPTION OF THE PREFERRED EMBODIMENTS

Referring to FIGS. 1–6, the motor according to the invention is composed of the laminated core 5 passing through the center of the winding coil 4, the stators 3, 3' which are incorporated with the core 5 and laminated similarly, the permanent air gap formed at the opposite portion of the stators 3, 3', the circular opening intersected by the permanent air gap, and the rotor accommodated in the circular opening.

Figure 1:
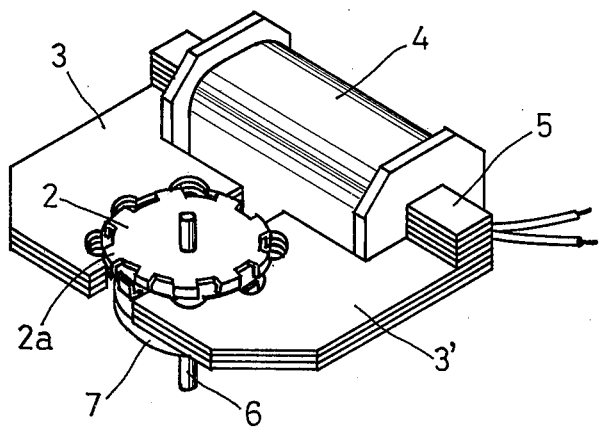
FIG. 1 is a perspective view illustrating an embodiment of the motor according to the present invention, the housing and rotor bearings thereof being removed.
Figure 4:
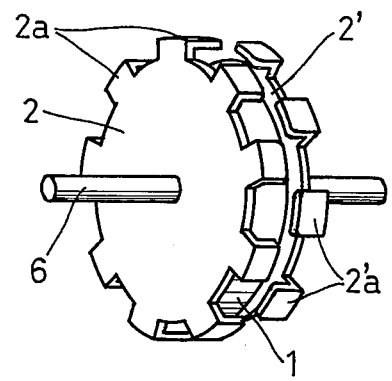
FIG. 4 is an enlarged perspective view of the rotor of the motor according to the invention.
Figure 5:
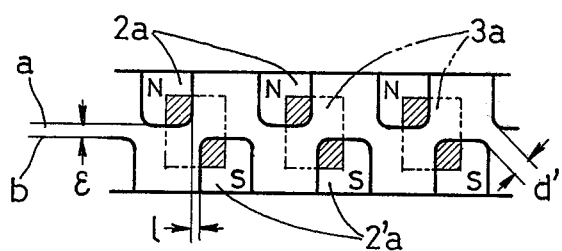
FIG. 5 is a schematic development view of disc poles of the rotor overlayed on the stator pole faces of the motor according to the invention.

The rotor of the motor is composed of a thin cylindrical permanent magnet 1 magnetized in the same direction as that of the arbor 6, which permanent magnet is sandwiched in between two circular discs 2, 2'. Each disc is notched on its periphery to provide plural (normally 5–25) equally-spaced and equally-sized teeth of nearly rectangular shape, and these teeth are bent so as to extend parallel to the arbor 6 and to face to each other but to be staggered peripherally, whereby each of the teeth $2a$ on the disc 2 is located between adjacent teeth $2'a$, $2'a$ of the disc 2', respectively. The magnetic flux emanated from the permanent magnet 1 goes through the discs 2, 2' combined with magnet 1 to the bent teeth on the peripheral surface of the discs thereby to provide north or south poles $2a$, $2'a$, $2a$, $2'a$, . . . alternately thereon, as shown in FIGS. 4 and 5. The designation 7 shows a fly-wheel set on the arbor 6 so as to smooth the rotation of the rotor.

The stators 3, 3' consist of laminations of three sheets of thin metal plate of high permeability and are combined, respectively, with the ends of the core 5 which consists of five sheets of thin metal plate of the same material as the above and which passes through the center of the winding coil 4. The respective other ends of the stators 3, 3' are opposite to each other to form a permanent air gap intensecting a circular opening for accommodating the rotor. The inside periphery of the circular opening is notched so as to provide stator pole faces $3a, 3a, \ldots, 3'a, 3'a, \ldots$ which pole faces are so positioned as to be opposite to the north and south poles $2a, 2'a$ of the rotor discs 2, 2'. The AC induced magnetic flux is conducted on the stator pole faces in such a manner as, during the first half of a cycle thereof all the stator pole faces $3a, 3a, \ldots$ on the stator 3 are polarized to become north poles, while all the stator pole faces $3'a, 3'a, \ldots$ on the stator 3' are polarized to become south poles. However, during the latter half of the cycle all the stator pole faces $3a, 3a, \ldots$ change into south poles, while all the stator pole faces $3'a, 3'a, \ldots$ change into north poles. The respective stator pole faces $3a$ and $3'a$ on the stator 3 and 3' are displaced by 180 electrical degrees Whereby, when such stator pole faces are polarized through the AC induced magnetic flux as above-mentioned, the rotor is urged to rotate in one direction.

Figure 2:
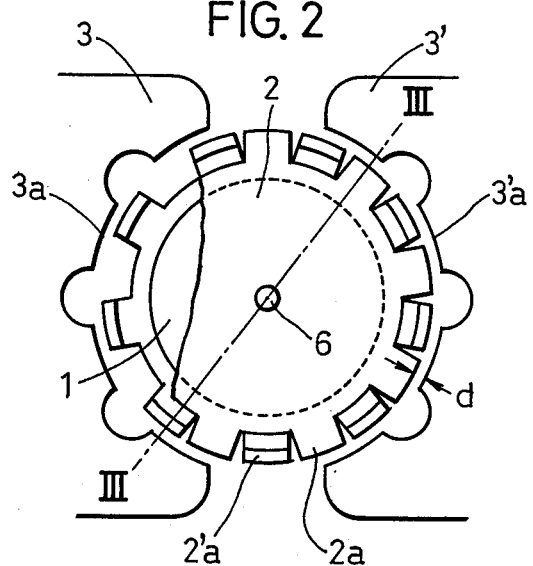
FIG. 2 is an enlarged plan view of the rotor and the adjacent portions of the stators of the motor in FIG. 1.
Figure 3:
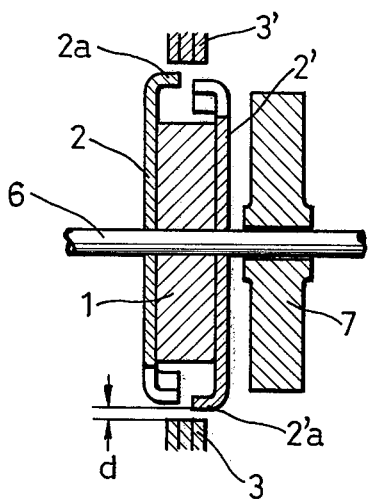
FIG. 3 is a sectional view of FIG. 2 on the line III—III.

Thus, according to the present invention, the dimensions of the disc poles of the rotor are designed as follows: referring now to FIGS. 2, 3 and 5, the distance $\epsilon$ between the lines or diametric planes $a$ and $b$, both of which include the free ends of the north or south disc poles $2a, 2a, \ldots$ or $2'a, 2'a, \ldots$ respectively, is 0–1.00 mm; the gap distance $d$ between each of the disc poles and the corresponding stator pole faces is 0.05–1.00 mm; and the ratio of $d'$, which represents the gap distance between adjacent north and south disc poles $2a$ and $2'a$, to the above-mentioned gap distance $d$, is 1.5–5. Both corners of the free ends of respective disc poles $2a, 2a, \ldots 2'a, 2'a, \ldots$ are desirably made round with the radius of curvature thereof being 0.05–2.00 mm. Further, the rotor in the invention has a diameter of 5–20 mm.

According to the present invention, because of the construction of the motor as described above, the leakage DC magnetic fluxes between the respectively adjacent north and south disc poles are relatively small, while the combination of the DC magnetic flux emanated from the disc poles with the AC energizing magnetic flux emanated from the stator pole faces is large, and thereby there results an improvement of the efficiency of the motor.

However, in case that at least one of the above-mentioned distance and the ratio $d'/d$ exceed(s) the respective upper limits of the values set forth above, the area of the disc poles of the rotor becomes smaller, thereby reducing disadvantageously the area of the overlapping portion of a disc pole on the corresponding stator pole face (cf. the oblique-lined portion in FIG. 5), through which portion the DC magnetic flux and the AC induced magnetic flux pass jointly.

FIG. 6 is a diagrammatic view showing the path of the DC magnetic flux when the motor of the invention has stopped, such situation being always involved when the motor has stopped. That is, the DC magnetic flux goes from the north pole of permanent magnet 1, through the disc pole $2a$ of rotor disc 2, across the air gap and through the stator pole face $3a$, back across the air gap again and through the disc pole $2'a$ of rotor disc 2', to the south pole of permanent magnet 1, so as to complete the path of the flux. In the above situation of the motor, which is also the same with that of the motor shown in FIG. 5, the DC magnetic flux linking the AC stator magnetic flux is at a maximum, so that when the motor starts from the above position a strong starting torque is available.

FIG. 7 and FIG. 8 show another embodiment of the motor according to the present invention, FIG. 7 being a plan view of the stator thereof while FIG. 8 is a sectional view of FIG. 7 on the line VIII—VIII. In this embodiment of the invention, no core extends through the energizing winding, and the motor is so constructed that the stators 8, 8' are arranged on opposite side-surfaces of the energizing winding 9 and have circular openings at the center parts thereof for accommodating the rotor, the inside peripheries of the openings being notched to form stator pole faces $8a, 8a, \ldots, 8'a, 8'a, \ldots$, which stator pole faces are bent so as to extend parallel to the arbor but to be staggered peripherally, and which are equally-spaced and equally-sized. The designation 10 shows the bobbin on which the winding 9 is wound. The rotor, which is designed with the dimension described previously, is arranged in the circular openings of the stators 8, 8' to complete the motor of the invention. The AC induced stator magnetic flux, the DC rotor magnetic flux and the operations of the motor thereby in this embodiment are substantially similar to those described with respect to the embodiment of the invention in FIGS. 1–6.

A test has been carried out using motors constructed as in accordance with the embodiment of the invention shown in FIGS. 1–6. The dimension of the rotor disc poles of the motors submitted to the test is shown in Table 1, in which, Nos. 1 and 2 represent the motors according to the invention, while No. 3 represents the conventional motor, wherein the minus sign of "0.74" means that the relative positions of the lines $a$ and $b$ in FIG. 5 are reversed. The designation $l$ in Table 1 represents the peripheral distance between adjacent sides of two poles, one a north pole on one disc and the other an immediately following south pole on the other disc.

Table 1

|  |  | No.1 | No.2 | No.3 |
|---|---|---|---|---|
| $\epsilon$ | ( mm ) | 0.33 | 0.10 | −0.74 |
| $l$ | ( mm ) | 0.20 | 0.20 | 0.20 |
| $d'$ | ( mm ) | 0.60 | 0.33 | 0.20 |
| $d$ | ( mm ) | 0.15 | 0.15 | 0.15 |
| $d'/d$ |  | 4.00 | 2.20 | 1.33 |

Other test conditions besides those described in Table 1 are shown below.

Energizing winding: 11,200 turns of wire having diameter of 0.07 mm;

Stator: a lamination of five sheets of the thin plate each having a thickness of 0.35 mm, the material of which plates is an iron alloy including 78% (by weight) nickel;

Core: a lamination of seven sheets of the same thin plate as above;

Permanent magnet: a cylinder having diameter of 8 mm and thickness of 1.4 mm, made of barium ferrite materials;

Rotor disc: each one sheet of the same thin plate as above, having 15 discs poles each and diameter of 9.5 mm, the curvature radius of the disc pole corner being 0.2 mm;

Rotation rate of rotor: 256 r.p.m.;
Sources of electricity: two "C" size dry cells of 1.5 V connected in series to provide 3 V;
Voltage wave: square wave;
Frequency: 64 Hz;
Current consumption of the electric circuit only: 98 μA;
Coil resistance: 1.32 K Ω;
Ambient temperature: 27.5°–25.5°C.

Table 2

|  | No. 1 | No. 2 | No. 3 |
|---|---|---|---|
| Efficiency (%) | 66.3 | 47.7 | 32.1 |
| Input (μW) | 478 | 430 | 455 |
| Output (μW) | 317 | 205 | 146 |
| Torque at 1 r.p.m. (g-cm) | 19.00 | 12.25 | 8.75 |
| Current consumption without load (μA) | 156 | 189 | 217 |
| Current consumption with maximum load (μA) | 266 | 255 | 268 |
| Inductance (H) | 14.3 | 13.5 | 12.3 |
| Magnetic flux density on periphery of rotor (Gauss) | 215 | 175 | 107.5 |

From the results of the above test, it is seen that, in the motor according to the invention, the efficiency is improved significantly. FIG. 9 is a graph drawn with rectangular co-ordinates graduating the ratio $d'/d$ on the X-axis and the values of the efficiency or the magnetic flux density on the periphery of the rotor on the Y-axis.

What is claimed is:

1. A synchronous motor for clocks comprising, in combination, an axially elongated multiturn winding adapted to be energized by connection to a source of AC potential; a stator of magnetically permeable metal including a core extending through said winding and two substantially flat stator sections having first ends connected to respective opposite ends of said core and second ends in spaced opposed relation to define an air gap therebetween; said second ends conjointly forming a circular opening intersected by said air gap and having its periphery formed with peripherally spaced notches to define plural stator pole faces; and a substantially flat rotor of magnetically permeable metal secured to an arbor and disposed in said circular opening, said rotor including a thin substantially flat cylindrical permanent magnet polarized axially of said arbor and sandwiched between two flat circular discs of magnetically permeable metal; the peripheries of said discs being notched to form equiangularly spaced substantially rectangular poles having equal angular extents substantially equal to their angular spacing; the poles on one disc being north poles and those on the other disc being south poles; the poles on each of the two discs being bent to extend axially toward facing relation with the poles on the other disc and parallel to said arbor, with the poles on each disc being staggered peripherally relative to the poles on the other disc; the free ends of the poles on each disc being spaced axially from the free ends of the poles on the other disc to provide gap distance between the north and south poles, and the gap distance between the north and south poles being greater than the radial gap between the rotor poles and said stator pole faces.

2. A synchronous motor for clocks, as claimed in claim 1, in which the axial gap between the north and south poles is from zero to 1.00 mm, the radial gap between the rotor poles and said stator pole faces is 0.05 to 1.00 mm, and the ratio of the gap distance between the north and south poles to the radial gap between the rotor poles and said stator pole faces being 1.5 to 5.0; said rotor having a diameter of 5 to 20 mm wherein the corners of the free ends of the rotor poles are rounded to have a radius of curvature from 0.05 to 2.00 mm.

3. A synchronous motor for clocks, as claimed in claim 2, wherein the material of said core and said stator sections is a highly permeable nickel-iron alloy.

4. A synchronous motor for clocks, as claimed in claim 2, in which said core and said stator sections consist of laminations of thin plates having high magnetic permeability.

5. A synchronous motor for clocks, as claimed in claim 4, in which the number of laminations in said core is substantially greater than the number of laminations in said stator sections.

6. A synchronous motor for clocks, as claimed in claim 4, in which said core consists of five laminations, said stator sections consist of three laminations, and said first ends of said stator sections are superposed on the respective opposite ends of said core.

* * * * *